(12) United States Patent
Kannan et al.

(10) Patent No.: US 10,775,429 B2
(45) Date of Patent: Sep. 15, 2020

(54) TESTING MONOLITHIC THREE DIMENSIONAL INTEGRATED CIRCUITS

(71) Applicant: MARVELL INTERNATIONAL LTD., Hamilton (BM)

(72) Inventors: Sukeshwar Kannan, Malta, NY (US); Abhishek Koneru, Novato, CA (US); Krishnendu Chakrabarty, Chapel Hill, NC (US)

(73) Assignees: Marvell Asia Pte., Ltd., Singapore (SG); Duke University, Durham, NC (US)

( * ) Notice: Subject to any disclaimer, the term of this patent is extended or adjusted under 35 U.S.C. 154(b) by 329 days.

(21) Appl. No.: 15/801,380

(22) Filed: Nov. 2, 2017

(65) Prior Publication Data
US 2019/0094294 A1 Mar. 28, 2019

Related U.S. Application Data

(60) Provisional application No. 62/563,964, filed on Sep. 27, 2017.

(51) Int. Cl.
*G01R 31/28* (2006.01)
*G01R 31/319* (2006.01)
*G01R 31/27* (2006.01)
*G01R 31/3185* (2006.01)

(52) U.S. Cl.
CPC ....... *G01R 31/2851* (2013.01); *G01R 31/275* (2013.01); *G01R 31/2884* (2013.01);
(Continued)

(58) Field of Classification Search
CPC .................................................. G01R 31/2851
(Continued)

(56) References Cited

U.S. PATENT DOCUMENTS 7,342,563 B2 * 3/2008 Eguchi .................. G02F 1/1309
345/55
8,129,256 B2   3/2012 Farooq et al.
(Continued)

OTHER PUBLICATIONS

P. Batude et al., "3-D Sequential Integration: A Key Enabling Technology for Heterogeneous Co-Integration of New Function With CMOS," IEEE Journal on Emerging and Selected Topics in Circuits and Systems, vol. 2, No. 4, 2012, pp. 714-722.
(Continued)

*Primary Examiner* — Ricky Ngon

(57) ABSTRACT

Monolithic three-dimensional integration can achieve higher device density compared to 3D integration using through-silicon vias. A test solution for M3D integrated circuits (ICs) is based on dedicated test layers inserted between functional layers. A structure includes a first functional layer having first functional components of the IC with first test scan chains and a second functional layer having second functional components of the IC with second test scan chains. A dedicated test layer is located between the first functional layer and the second functional layer. The test layer includes an interface register controlling signals from a testing module to one of the first test scan chains and the second test scan chains, and an instruction register connected to the interface register. The instruction register processes testing instructions from the testing module. Inter-layer vias connect the first functional components, the second functional components, and the testing module through the test layer.

20 Claims, 15 Drawing Sheets

(52) U.S. Cl.
CPC ............... *G01R 31/31903* (2013.01); *G01R 31/318513* (2013.01); *G01R 31/318563* (2013.01)

(58) Field of Classification Search
USPC ....................................................... 702/120
See application file for complete search history.

(56) References Cited

U.S. PATENT DOCUMENTS

| | | | |
|---|---|---|---|
| 8,158,515 B2 | 4/2012 | Farooq et al. | |
| 8,492,886 B2 | 7/2013 | Or-Bach et al. | |
| 9,110,136 B2 | 8/2015 | Goel et al. | |
| 9,222,983 B2 | 12/2015 | Goel | |
| 9,460,978 B1 | 10/2016 | Or-Bach et al. | |
| 9,509,313 B2 | 11/2016 | Or-Bach et al. | |
| 9,564,432 B2 | 2/2017 | Or-Bach et al. | |
| 9,577,642 B2 | 2/2017 | Or-Bach et al. | |
| 10,177,142 B2* | 1/2019 | Tamura | H01L 27/088 |
| 2003/0025191 A1* | 2/2003 | Takeoka | G01R 31/318538 257/700 |
| 2005/0154552 A1* | 7/2005 | Stroud | G01R 31/2882 702/120 |
| 2011/0254589 A1* | 10/2011 | Gammel | G11C 13/0004 326/51 |
| 2015/0095729 A1* | 4/2015 | Goel | G01R 31/3177 714/726 |
| 2016/0111369 A1* | 4/2016 | Or-Bach | H01L 29/66825 257/757 |
| 2017/0343603 A1* | 11/2017 | Chakrabarty | G01R 31/44 |

OTHER PUBLICATIONS

K. Arabi et al., "3D VLSI: A Scalable Integration Beyond 2D," Proceedings of the 2015 Symposium on International Symposium on Physical Design, 2015, pp. 1-7.

P. Batude et al., "3DVLSI with CoolCube Process: An Alternative Path to Scaling," Symposium on VLSI Technology Digest of Technical Papers, 2015, pp. T48-T49.

K. Chang et al., "Design Automation and Testing of Monolithic 3D ICs: Opportunities, Challenges, and Solutions," ICCAD, 2017, pp. 1-6.

A. Koneru et al., "Impact of Electrostatic Coupling and Wafer-Bonding Defects on Delay Testing of Monolithic 3D Integrated Circuits," ACM Transactions on Design Automation of Electronic Systems, 2016, pp. 1-22.

A. Koneru et al., "Analysis of Electrostatic Coupling in Monolithic 3D Integrated Circuits and its Impact on Delay Testing," 21st IEEE European Test Symposium, 2016, pp. 1-6.

A. Koneru et al., "Impact of Wafer-Bonding Defects on Monolithic 3D Integrated Circuits", EPEPS, 2016, pp. 1-3.

E. J. Marinissen et al., "IEEE Std P1838: DfT Standard-Under-Development for 2.5D-, 3D-, and 5.5D-SICs," 21st IEEE European Test Symposium (ETS), 2016, pp. 1-10.

X. Dong et al., "Fabrication Cost Analysis and Cost-Aware Design Space Exploration for 3-D ICs," IEEE Transactions on Computer-Aided Design of Integrated Circuits and Systems, vol. 29, No. 12, Dec. 2010, pp. 1959-1972.

T. Nakazawa et al., "IC Substrate Package Yield Prediction Model and Layer Level Risk Assessment by Design Analysis," IEEE Transactions on Semiconductor Manufacturing, vol. 29, No. 3, Aug. 2016, pp. 257-262.

E. Singh, "Analytical Modeling of 3D Stacked IC Yield from Wafer to Wafer Stacking with Radial Defect Clustering," 27th International Conference on VLSI Design and 13th International Conference on Embedded Systems, 2014, pp. 26-31.

E. J. Marinissen et al., "Testing 3D Chips Containing Through-Silicon Vias," IEEE, 2009, pp. 1-11.

S. Panth et al., "Power-Performance Study of Block-Level Monolithic 3D-ICs Considering Inter-Tier Performance Variations," ACM, 2014, pp. 1-6.

\* cited by examiner

TESTING MONOLITHIC THREE DIMENSIONAL INTEGRATED CIRCUITS

CROSS-REFERENCE TO RELATED APPLICATIONS

The present application claims priority to U.S. Provisional Application Ser. No. 62/563,964 filed on Sep. 27, 2017, the entire teachings of which are incorporated herein by reference.

BACKGROUND

Field of the Invention

The present disclosure relates to the field of semiconductor integrated circuit (IC) manufacturing, and more specifically, to design for test structures in monolithic three-dimensional integrated circuits.

Description of Related Art

Monolithic three-dimensional (M3D) integration is an emerging technology in which transistors are processed layer-by-layer on the same wafer. Sequential integration of transistor layers enables high-density vertical interconnects, known as inter-layer vias (ILVs). The size and pitch of an ILV are typically one to two orders of magnitude smaller than those of a through-silicon via (TSV). Therefore, M3D integration can result in reduced area and higher performance compared to three-dimensional (3D) die stacking.

New test solutions are required for M3D integrated circuits (ICs) due to the significant differences between M3D and TSV based 3D wafers in terms of design, fabrication, failure modes, and test constraints.

SUMMARY

In view of the foregoing, one exemplary embodiment disclosed herein is a structure. The structure includes a first functional layer having first test scan chains. A first inter-layer dielectric layer is on the first functional layer. A test layer is on the first inter-layer dielectric layer. A second inter-layer dielectric layer is on the test layer. A second functional layer is on the second inter-layer dielectric layer. The second inter-layer dielectric layer has second test scan chains. A third inter-layer dielectric layer is on the second functional layer and has connections to a testing module. The test layer includes an interface register controlling signals from the testing module to one of the first test scan chains and the second test scan chains, and an instruction register connected to the interface register. The instruction register processes testing instructions from the testing module. Inter-layer vias connect the first functional components, the second functional components, and the testing module through the test layer and the inter-layer dielectric layers.

In one particular structure embodiment, the structure has a first functional layer with a top surface and a bottom surface. The first functional layer includes first functional components of an integrated circuit (IC), and first test scan chains connected to the first functional components. The first scan chains have first input and output connections. A first inter-layer dielectric layer having a top surface and a bottom surface is formed on the first functional layer. The bottom surface of the first inter-layer dielectric layer is connected to the top surface of the first functional layer. A test layer having a top surface and a bottom surface is formed on the first inter-layer dielectric layer. The bottom surface of the test layer is connected to the top surface of the first inter-layer dielectric layer. A second inter-layer dielectric layer having a top surface and a bottom surface is formed on the test layer. The bottom surface of the second inter-layer dielectric layer is connected to the top surface of the test layer. A second functional layer having a top surface and a bottom surface is formed on the second inter-layer dielectric layer. The bottom surface of the second functional layer is connected to the top surface of the second inter-layer dielectric layer. The second functional layer includes second functional components of the IC, and second test scan chains connected to the second functional components. The second scan chains have second input and output connections. A third inter-layer dielectric layer having a top surface and a bottom surface is formed on the second functional layer. The bottom surface of the third inter-layer dielectric layer is connected to the top surface of the second functional layer and has connections to a testing module. The test layer includes an interface register controlling signals from the testing module to one of the first test scan chains and the second test scan chains and an instruction register connected to the interface register. The instruction register processes testing instructions from the testing module. A test access point (TAP) controller is connected to the interface register and the instruction register. A first multiplexer has a data input from the interface register and a control input from the instruction register. A second multiplexer has a data input from the instruction register and from the output of the first multiplexer and a control input from the TAP controller. Inter-layer vias connect the testing module to the first test scan chains and the second test scan chains through the interface register of the test layer.

For example, one method embodiment disclosed herein can be used to test an IC structure. Specifically, in this method embodiment a stacked integrated circuit (IC) chip is received. The stacked IC chip has a first functional layer having first functional components of the integrated circuit and first test scan chains connected to the first functional components. The first scan chains have first input and output connections to a testing module. The stacked IC chip has a second functional layer having second functional components of the integrated circuit and second test scan chains connected to the second functional components. The second scan chains have second input and output connections to the testing module. A test layer is between the first functional layer and the second functional layer, the test layer has an interface register connected to the first test scan chains and the second test scan chains. An instruction register is connected to the interface register. A test access point (TAP) controller is connected to the interface register and the instruction register. Inter-layer vias connect the testing module to the first test scan chains and the second test scan chains through the interface register of test layer. One of the first test scan chains and the second test scan chains is selected for testing using the interface register. Testing instructions are processed from the testing module to the one of the first test scan chains and the second test scan chains using the instruction register. The testing instructions generate test patterns for detecting faults in one of the first functional layer and the second functional layer according to associated test chains. The flow of data for the test patterns is controlled using the TAP controller connected to the interface register and the instruction register.

BRIEF DESCRIPTION OF THE DRAWINGS

Various examples of the devices and methods of the present invention will be better understood from the following detailed description with reference to the drawings, which are not necessarily drawn to scale and in which.

DETAILED DESCRIPTION

Figure 1:
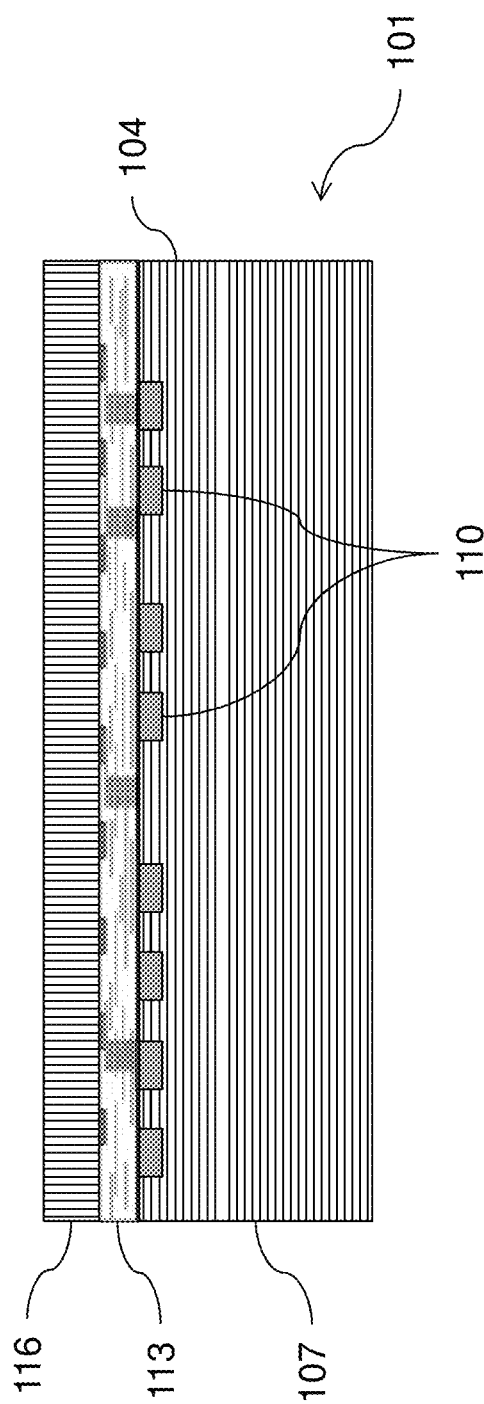
FIGS. 1-8 are schematic diagrams illustrating the processing steps for producing a monolithic three-dimensional integrated circuit according to devices and methods herein.

The following detailed description of the devices and methods, as represented in the drawings, is not intended to limit the scope defined by the appended claims, but is merely representative of selected devices and methods. The following description is intended only by way of example, and simply illustrates certain concepts of the devices and methods, as disclosed and claimed herein.

Due to the above benefits, there is growing interest towards the adoption of M3D. However, test challenges for M3D have remained largely unexplored. Industry presentations have highlighted concerns about defects that may arise in the bottom layer when additional layers are processed. In addition, non-bottom layers are susceptible to process variations and electrostatic coupling, and the ILVs are prone to shorts, opens, and delay defects. Therefore, there is a need for design-for-test (DfT) solutions to enable defect isolation and yield enhancement.

According to devices and methods herein, the IEEE Standard P1838 can be extended for M3D ICs. P1838 mandates the insertion of a die wrapper register for TSV-based 3D ICs that provides controllability and observability. A similar register for M3D can enable modular testing by supporting inward-facing and outward-facing test modes. However, the overhead due to this register at the boundary of every layer can be significant since the number of ILVs in M3D ICs is expected to be an order of magnitude higher compared to TSV-based 3D ICs.

Although the extension of P1838 to M3D enables reuse of methods developed for TSV-based 3D ICs, new test solutions are needed due to the significant differences between M3D and TSV-based 3D in terms of design, fabrication, failure modes, and test constraints. Moreover, a die (including the TSVs) can be tested pre-bond and a known-good die can be used for a TSV-based 3D stack. On the other hand, ILVs are absent in the uppermost layer during partial-assembly test.

Due to these differences and the difficulty of extending P1838 to M3D ICs, a test solution based on dedicated test layers that are inserted between functional layers is disclosed. These dedicated test layers provide controllability and observability to signals at the interfaces of functional layers. The main features of a test layer are: (1) a low-bandwidth serial interface, and a higher-bandwidth parallel interface, (2) dedicated probe pads on all layers, except the top layer, to enable partial-assembly testing, and (3) test structures to enable modular testing.

The addition of test layers to the M3D assembly can potentially lower chip yield because of more candidate defect locations. However, the improvement in test coverage and defect-isolation capability offsets this concern. Moreover, the dedicated test layers can be manufactured using a mature technology and the number of back-end-of-the-line (BEOL) layers can be minimized to reduce the impact on die yield. The impact on chip performance is also minimal since the size of an ILV that connects logic in the test layer to logic in the functional layer is comparable to that of a conventional TSV.

As mentioned above, new test solutions are required for M3D integrated circuits (ICs) due to the significant differences between M3D and TSV based 3D wafers in terms of design, fabrication, failure modes, and test constraints. Accordingly, a test solution based on dedicated test layers that are inserted between functional layers is disclosed. These dedicated test layers provide controllability and observability to signals at the interfaces of functional layers. Some of the features of a test layer are: (1) a low-bandwidth serial interface, and a higher-bandwidth parallel interface, (2) dedicated probe pads on all layers, except the top layer, to enable partial-assembly testing, and (3) test structures to enable modular testing.

Referring to the drawings, FIGS. 1-8 illustrate the processing steps for producing a monolithic three-dimensional integrated circuit according to devices and methods herein. An integrated circuit (IC) is a semiconductor device containing many small, interconnected components such as diodes, transistors, resistors, and capacitors. These components function together to enable the IC to perform a task, such as control an electronic device, or perform logic operations. ICs are found in computers, calculators, cellular telephones, and many other electronic devices.

ICs and other semiconductor devices are fabricated on small rectangles, known as "dies," which are filled with multiple layers of the components, such as transistors, resistors, and capacitors, during the fabrication process. The connections between the layers are known as vias. In integrated circuit design, a via is a small opening in a layer that allows a conductive connection between different layers. In M3D structures, the vias are referred to as inter-layer vias.

In FIG. 1 a bottom layer, indicated generally as 101, may be created having a first functional layer 104 in a first substrate 107. The first substrate 107 may be any conventional semiconductor substrate such as, for example, a bulk silicon substrate or an active layer of semiconductor material of a semiconductor-on-insulator wafer (e.g., a silicon-on-insulator (SOI) wafer or any other suitable semiconductor-on-insulator wafer) (not shown). Such a semiconductor-on-insulator wafer can include a substrate (e.g., a silicon substrate or any other suitable substrate including, but not limited to, a silica glass substrate or a silicon carbide (SiC) substrate), an insulator layer (e.g., a buried oxide (BOX) layer or other suitable insulator layer) on the substrate, and a semiconductor layer on the insulator layer. In any case, the first substrate 107 (or, if applicable, the semiconductor layer of the semiconductor-on-insulator wafer) can be made of a first semiconductor material (e.g., silicon or some other suitable monocrystalline semiconductor material). First functional elements 110, such as transistors, resistors, and/or capacitors, are formed in the first substrate 107 using known front-end-of-line (FEOL) processes. Connections between the first functional elements 110 may be formed in a first set of one or more metallization layers 113 using known back-end-of-line (BEOL) processes. The first set of metallization layers 113 may then be capped by a silicon dioxide (SiO2) layer 116.

Figure 2:
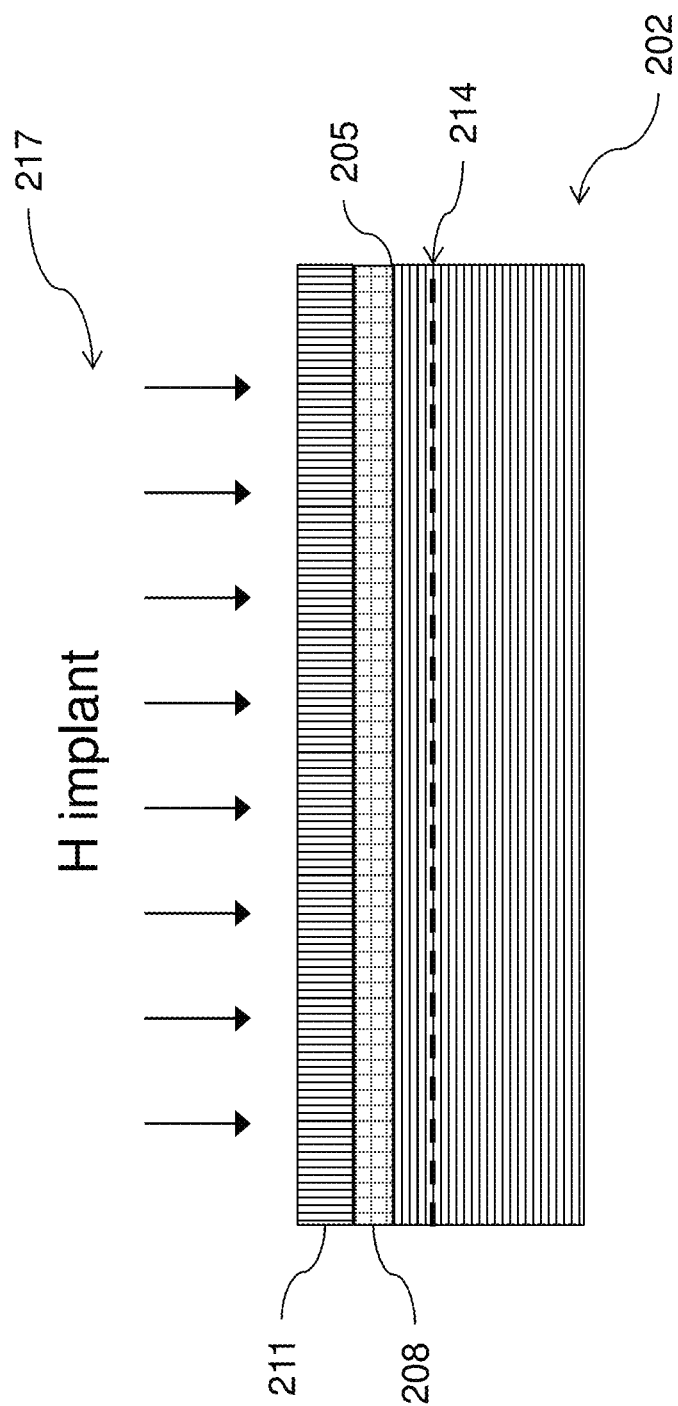

In FIG. 2 a second wafer 202 that is to be stacked on the bottom layer 101 may be created using a second substrate 205. As above, the second substrate 205 may be any suitable material, such as plain silicon. An amorphized layer 208 may be deposited on the second substrate 205. The amorphized layer 208 may then be capped by its own silicon dioxide (SiO2) layer 211. A fracture plane 214 may be created in the second substrate 205 by using a hydrogen (H) implant 217.

Figure 3:
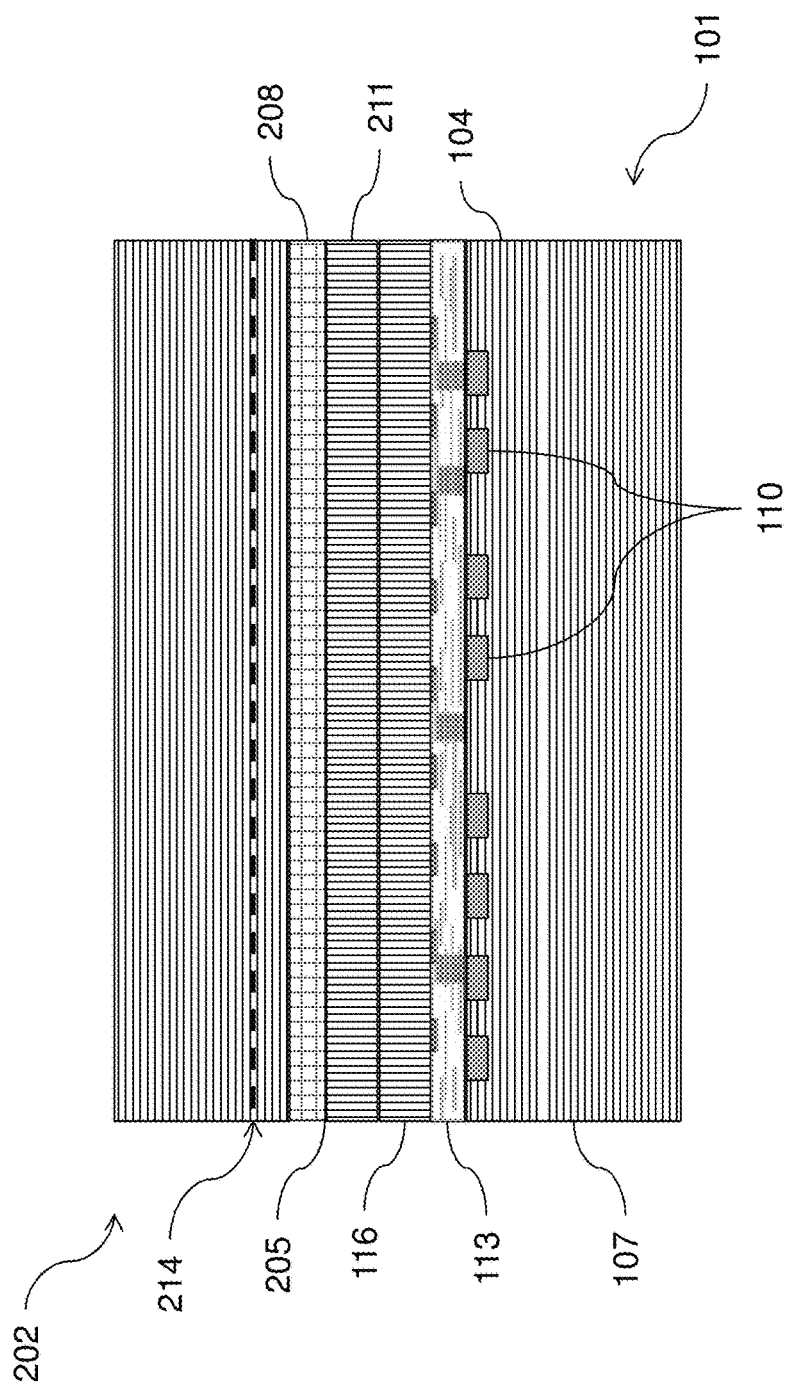

The second wafer 202 may be flipped over and attached to the bottom layer 101, as shown in FIG. 3. The SiO2 layer 116 of the bottom layer 101 bonds to the SiO2 layer 211 of the second wafer 202.

Figure 4:
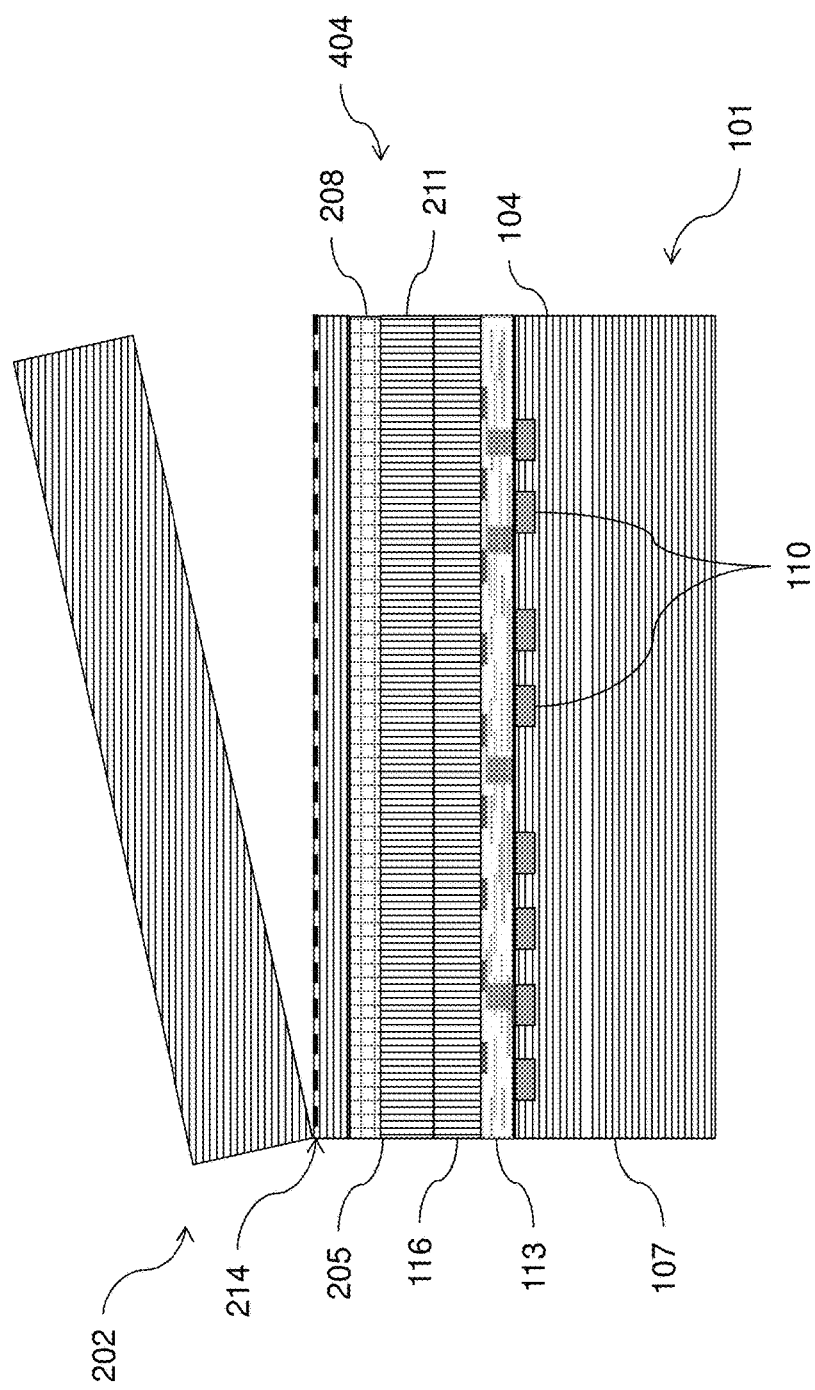

In FIG. 4, a mechanical force can be used to cleave a portion of the second substrate 205 at the fracture plane 214, leaving the amorphized layer 208. Typically, the mechanical force is applied sideways at the fracture plane 214, leaving a top layer 404.

Figure 5:
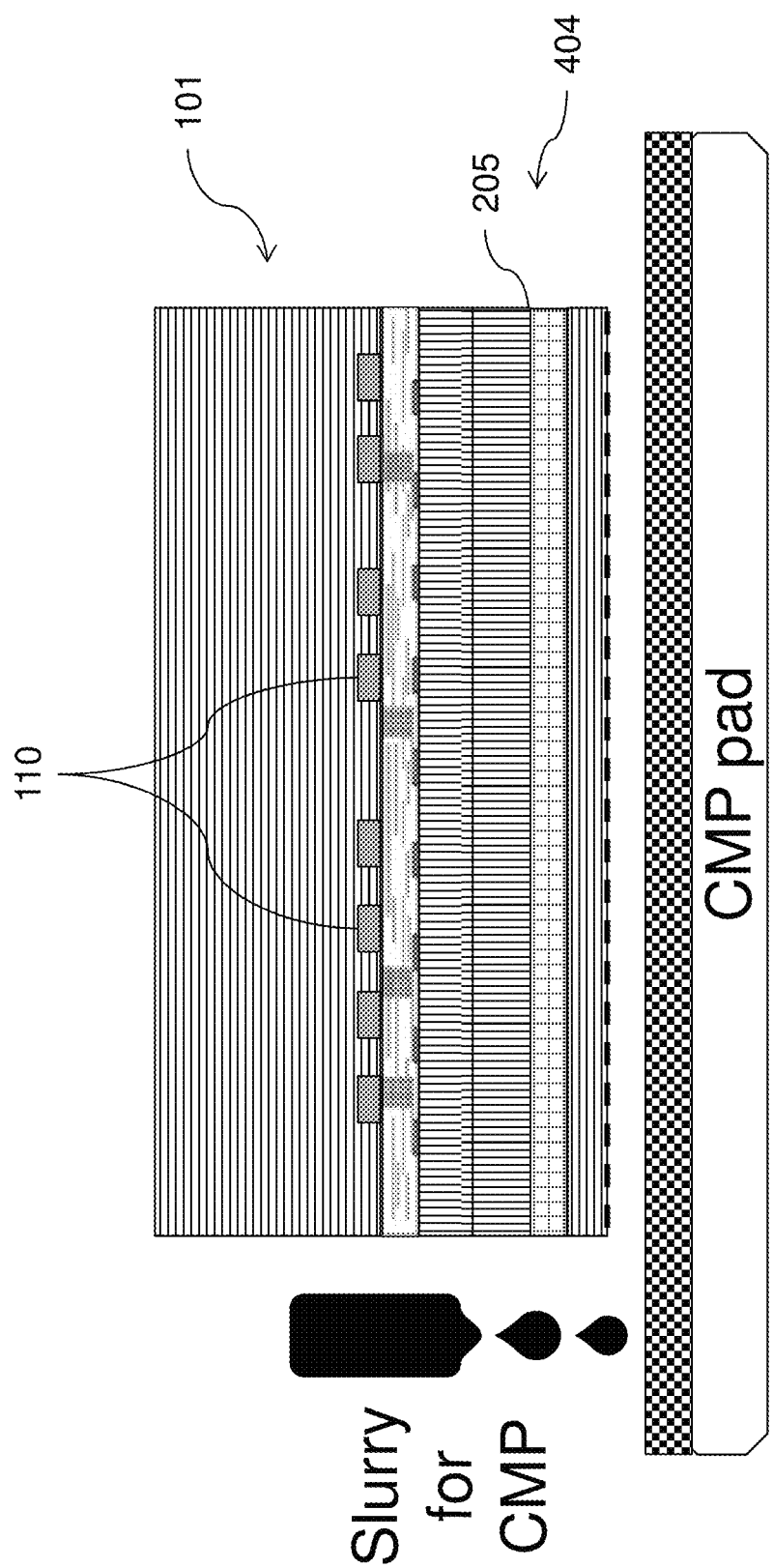

As shown in FIG. 5, the remaining top portion of the second substrate 205 (i.e., the top layer 404) may be cleaned and polished using a CMP (chemical-mechanical polishing) process. The CMP process combines abrasion and dissolution to remove excess material from the surface of the top layer 404. The details regarding CMP processing are not set forth herein, in order to allow the reader to focus on the salient aspects of the disclosed process.

Figure 6:
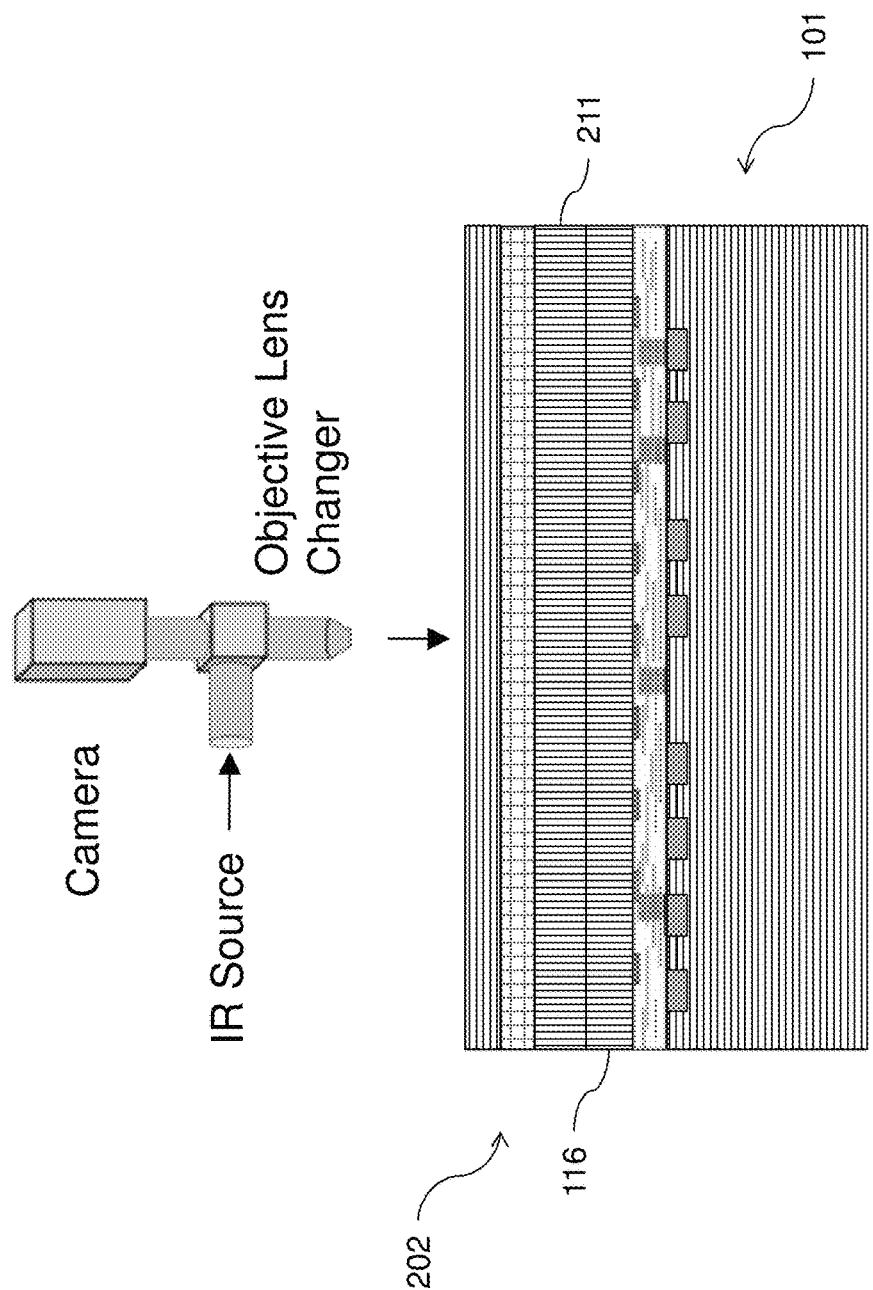

In FIG. 6, an inspection may be conducted of the bond interface between the SiO2 layer 116 of the bottom layer 101 and the SiO2 layer 211 of the second wafer 202. This may be an infrared (IR) inspection to check for voids and other structural defects.

Figure 7:
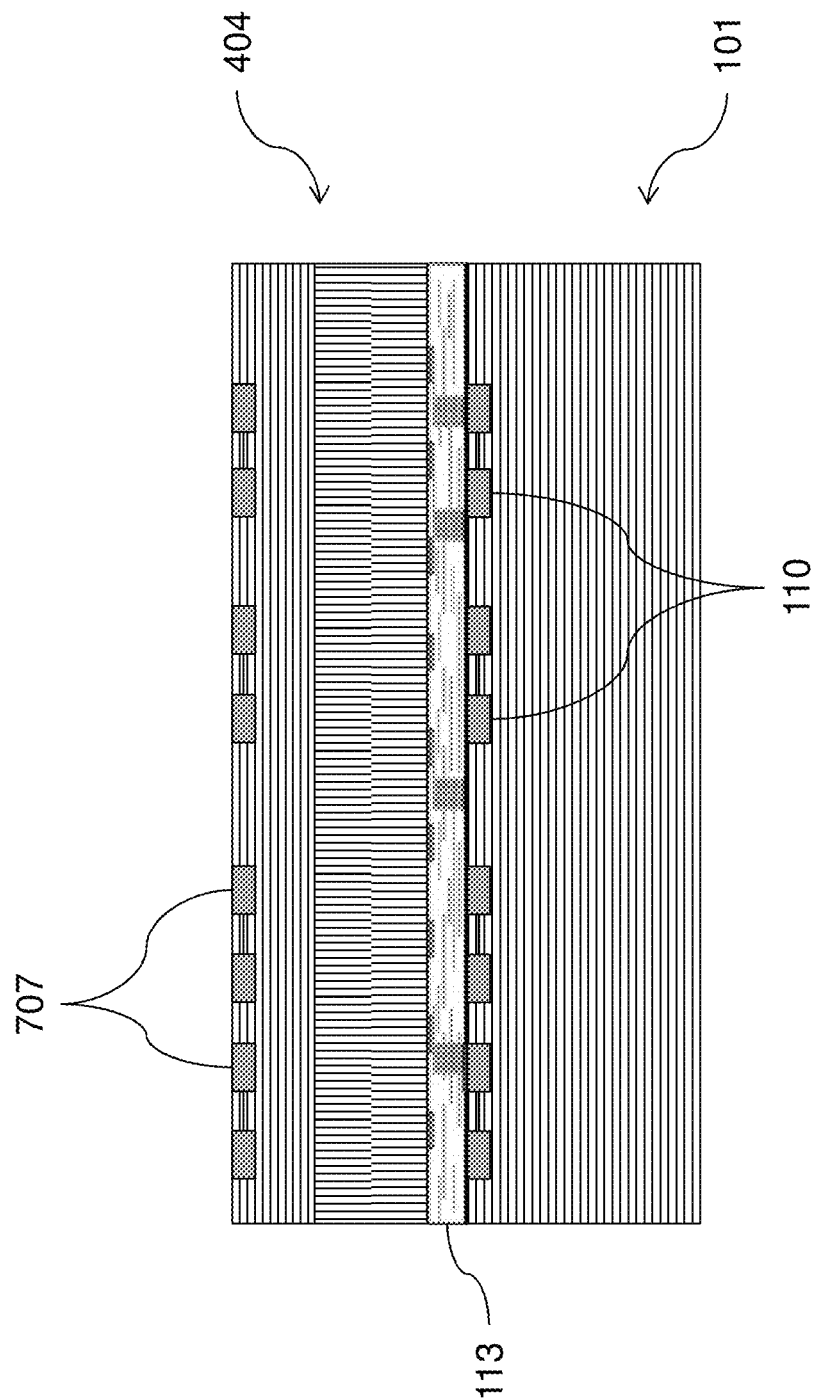

As shown in FIG. 7, second functional elements 707, such as transistors, resistors, and/or capacitors, may be formed in the top layer 404 using known front-end-of-line (FEOL) processes.

Figure 8:
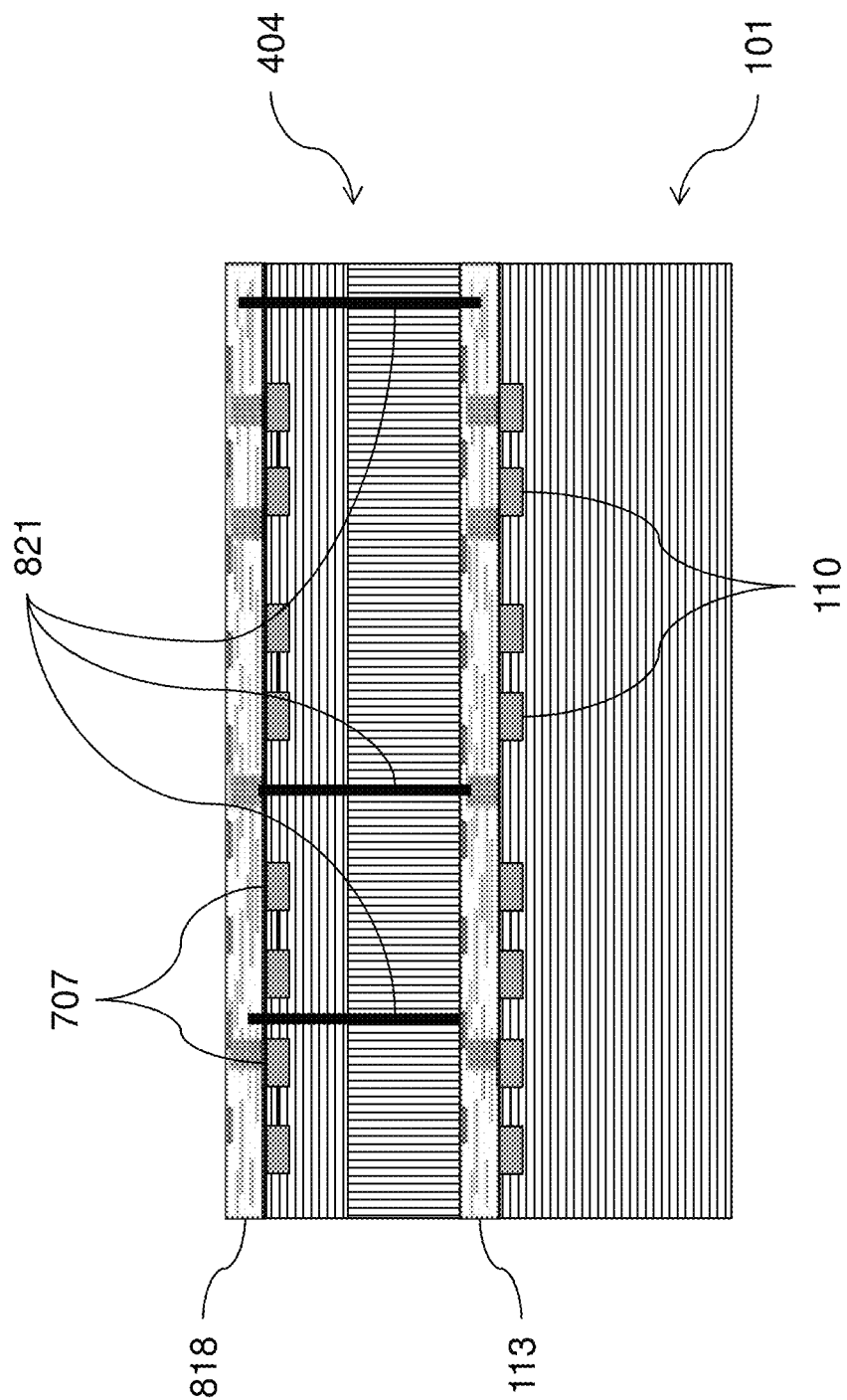

In FIG. 8, connections between the second functional elements 707 may be formed in a second set of one or more metallization layers 818, using known back-end-of-line (BEOL) processes. Then inter-layer vias (ILVs) 821 may be processed to create connections between the first set of metallization layers 113 and the second set of metallization layers 818. That is, the ILVs 821 connect the top layer 404 to the bottom layer 101. The ILVs 821 may be formed by etching and filling with a metal conductor, such as copper (Cu).

Figure 9:
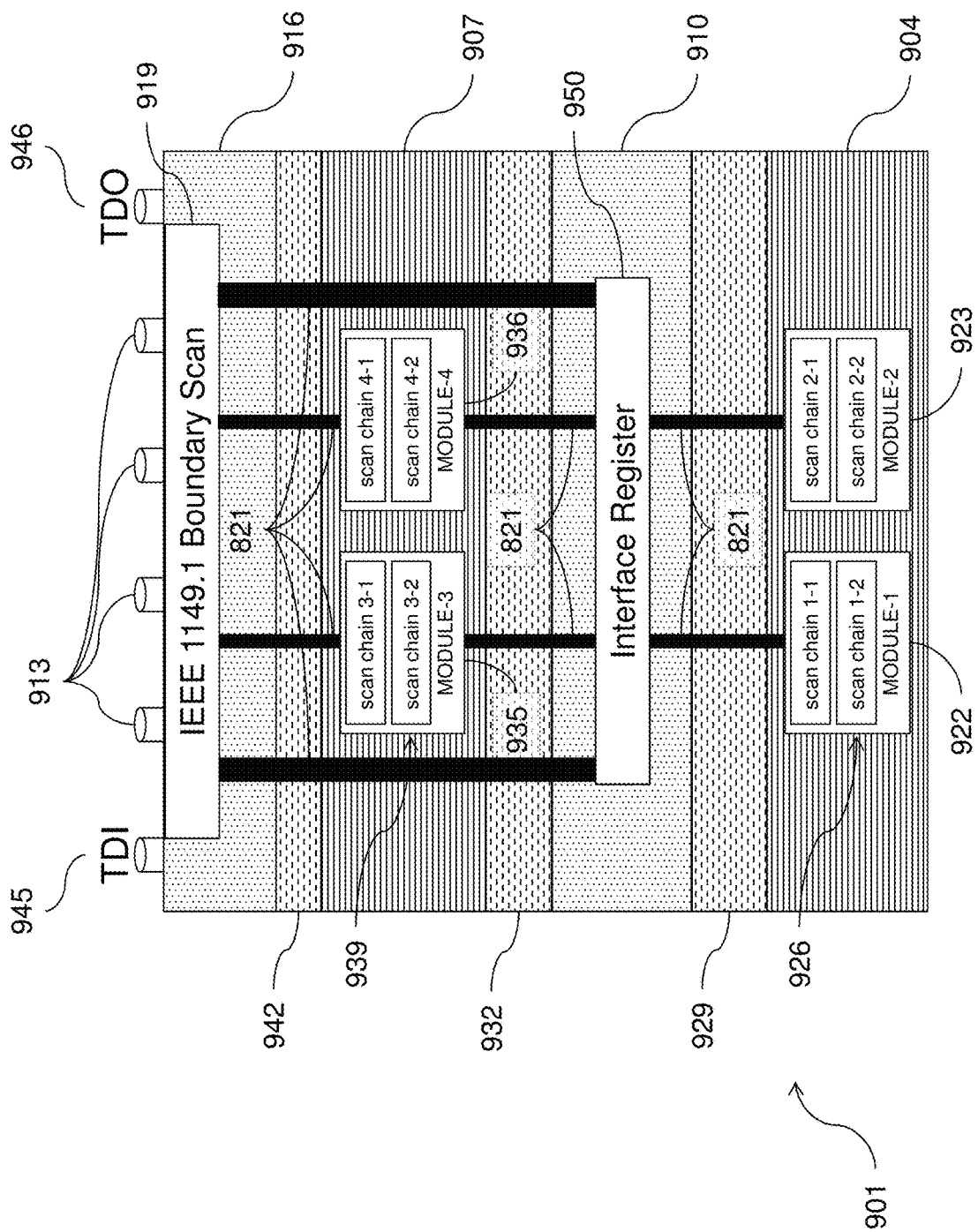
FIG. 9 is a schematic diagram of an exemplary test structure according to devices and methods herein.

Referring now to FIG. 9 showing a monolithic three-dimensional (M3D) integrated circuit, indicated generally as 901. For illustration purposes, The M3D IC 901 contains at least two functional layers. As described herein, the functional layer that is processed first is referred to as the bottom layer 904, and the functional layer that is processed at the end is referred to as the top layer 907. A dedicated test layer 910 is placed between the two functional layers, e.g., the bottom layer 904 and the top layer 907. In order to connect the test layer 910 to a testing module, input/output (I/O) pins 913 are located on the top layer 907. It should be noted that the design for test (DfT) architecture could also be used for an M3D IC in which the I/O pins 913 are located on the bottom layer 904. Further, as described herein, the collection of signals going from a particular layer to another layer in the direction of the I/O pins 913 is referred to as the primary interface, and the collection of signals going to a layer in the direction opposite to the I/O pins is referred to as a secondary interface corresponding to this layer. The functional layers may be known as intra-layer DfT and the test layers may be known as layer-level DfT.

An overview of the DfT architecture is presented in FIG. 9 with two functional layers (e.g., bottom layer 904 and top layer 907) and two test layers, the dedicated test layer 910 and an upper test layer 916 on which the I/O pins 913 of the IC are located. The I/O pins 913 may be wrapped by an IEEE 1149.1 boundary scan register 919. As would be known by one of ordinary skill in the art, circuitry that may be built into an integrated circuit to assist in the test, maintenance and support of assembled printed circuit boards and the test of internal circuits is defined in IEEE 1149.1. The circuitry may include a standard interface through which instructions and test data are communicated. A set of test features may also be defined, including a boundary scan register 919, such that the M3D IC 901 is able to respond to a minimum set of instructions designed to assist with testing of the assembled printed circuit board. Also, a language may be defined that allows rigorous structural description of the component-specific aspects of such testability features, and a second language may be defined that allows rigorous procedural description of how the testability features may be used.

The bottom functional layer 904 has a top surface and a bottom surface and includes first functional components, such as MODULE-1 922 and MODULE-2 923. First test scan chains 926, such as scan chain 1-1 and scan chain 1-2 of MODULE-1 922 and scan chain 2-1 and scan chain 2-2 of Module-2 923, are connected to the first functional components. A first inter-layer dielectric (ILD) layer 929 having a top surface and a bottom surface is formed on the bottom functional layer 904. The bottom surface of the first ILD layer 929 is connected to the top surface of the bottom functional layer 904. The material for any ILD layer can be, for example, silicon oxide or any other suitable ILD material (e.g., borophosphosilicate glass (BPSG), tetraethyl orthosilicate (TEOS), fluorinated tetraethyl orthosilicate (FTEOS), etc.). The dedicated test layer 910 has a top surface and a bottom surface. The bottom surface of the dedicated test layer 910 is connected to the top surface of the first ILD layer 929. A second ILD layer 932 having a top surface and a bottom surface is formed on the dedicated test layer 910. The bottom surface of the second ILD layer 932 is connected to the top surface of the dedicated test layer 910. The top functional layer 907 is formed on the second ILD layer 932. The top functional layer 907 has a top surface and a bottom surface and includes second functional components, such as MODULE-3 935 and MODULE-4 936. Second test scan chains 939, such as scan chain 3-1 and scan chain 3-2 of MODULE-3 935 and scan chain 4-1 and scan chain 4-2 of MODULE-4 936, are connected to the second functional components. The bottom surface of the top functional layer 907 is connected to the top surface of the second ILD layer 932. A third ILD layer 942 having a top surface and a bottom surface is formed on the top functional layer 907. The bottom surface of the third ILD layer 942 is connected to the top surface of the top functional layer 907. Inter-layer vias 821 connect the first test scan chains 926 and the second test scan chains 939 to the testing module through an interface register 950 in the dedicated test layer 910 using I/O pins 913.

The upper test layer 916 for the top functional layer 907 is optional, and the IEEE 1149.1 boundary scan register 919 can be placed in the top functional layer 907 itself. Additional pins may be used for boundary scan, such as TDI 945 (for Test Data In) and TDO 946 (for Test Data Out) as shown.

Figure 10:
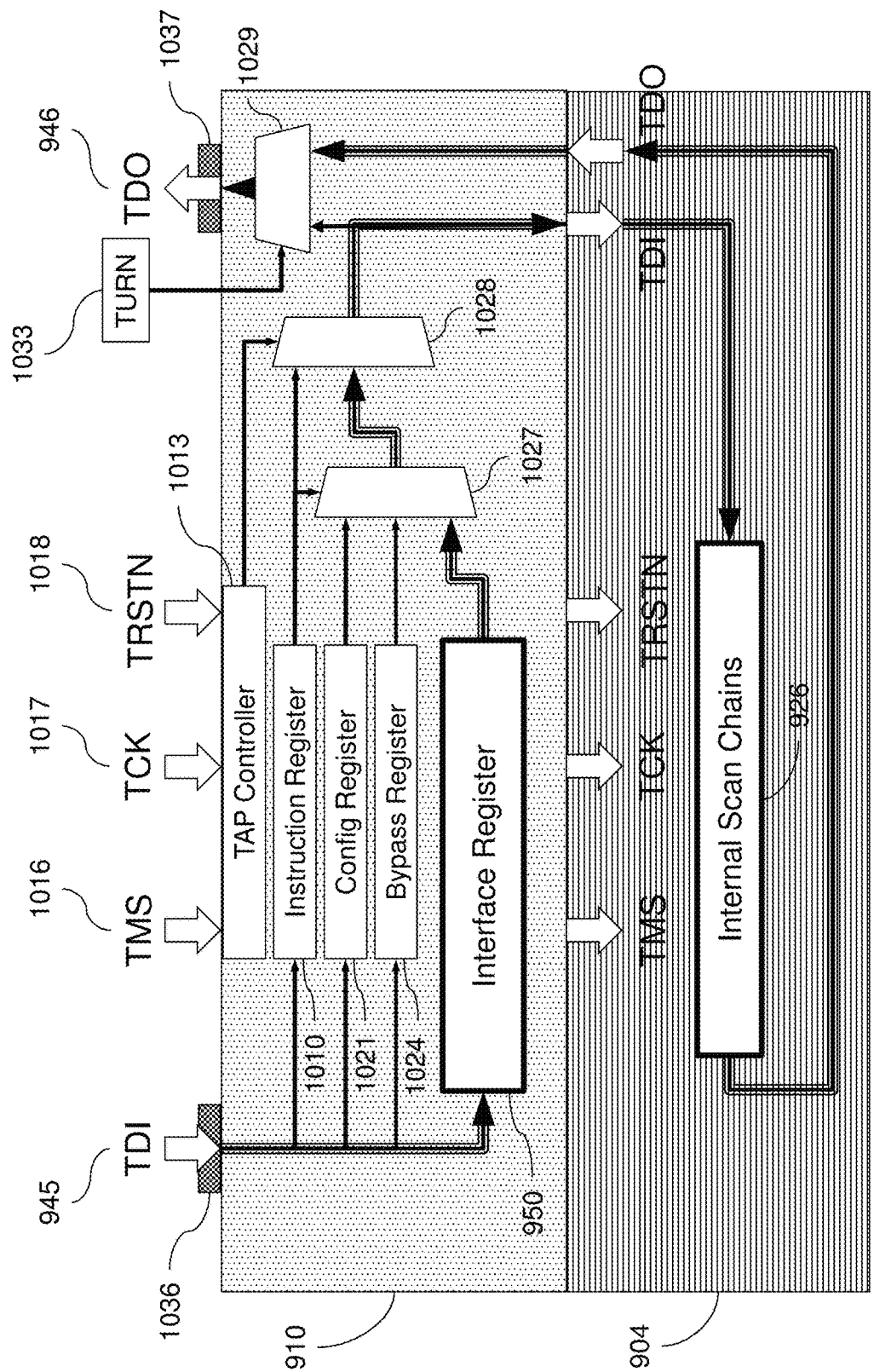
FIG. 10 is a schematic diagram of an exemplary test structure for which the test layer is the primary interface with the functional layer according to devices and methods herein.

As shown in FIG. 10, the dedicated test layer 910 includes the interface register 950 controlling signals from the testing module to one of the first test scan chains 926 and the second test scan chains 939. An instruction register 1010 is connected to the interface register 950. The instruction register 1010 processes testing instructions from the testing module. The instruction register 1010 holds the instruction currently being executed. Each instruction to be executed is loaded into the instruction register 1010, which holds it while it is decoded, prepared, and ultimately executed. The output of the instruction register 1010 is available to control circuits that generate the timing signals that control the various processing elements involved in executing the instruction. The instruction register 1010 processes testing instructions from the testing module and selects a test data register to be active between TDI 945 and TDO 946.

A test access point (TAP) controller 1013 is connected to the interface register 950 and the instruction register 1010. The TAP controller 1013 has a set of output pins and input pins that allow it to serially insert and extract internal register data. In particular, the TAP controller 1013 can be programmed by inputs for the Test Mode Select (TMS) 1016, Test Clock (TCK) 1017, and test string controller (TRSTN) 1018, which controls the flow of data bits to the Instruction Register 1010. Since the data is processed serially, the registers that will be read or written through the TAP controller 1013 may be arranged in a daisy-chain fashion. This structure is sometimes called a boundary scan chain.

As shown in FIG. 10, the dedicated test layer 910 can also include a configuration register 1021, a bypass register 1024, and multiplexers, such as 1027, 1028, 1029. The configuration register 1021 determines the configuration of the TAP controller 1013. The bypass register 1024 enables testing of the dedicated test layer 910 itself.

The multiplexers in the dedicated test layer 910 receive data and control inputs to direct the flow of test data, as described in more detail below. A first multiplexer 1027 has a data input from the interface register 950, the bypass register 1024, and the configuration register 1021. The control input for the first multiplexer 1027 is from the instruction register 1010. A second multiplexer 1028 has a data input from the instruction register 1010 and from the output of the first multiplexer 1027. The control input for the second multiplexer 1028 is from the TAP controller 1013. A third multiplexer 1029 directs the flow of test data for whichever functional layer is under test. The control input for the third multiplexer 1029 is a "TURN" signal 1033, which determines whether the test signal reaches the functional layer below or above the test layer, i.e., the bottom layer 904 or the top layer 907. The TURN signal 1033 is described in further detail below.

The functional layers may have intra-layer DfT such as scan-chains, test data CoDeCs, IEEE Std. wrappers, and test access mechanisms. All the layer-level DfT is located in the dedicated test layer 910, thus facilitating the reuse of test structures. In addition, the dedicated test layer 910 can be common for multiple functional layers, such as bottom layer 904 and top layer 907.

According to devices and methods herein, the interface register 950 is located in the dedicated test layer 910 to control and observe the signals at the interface of two functional layers (bottom layer 904 and top layer 907). By placing the interface register 950 on the dedicated test layer 910, no test structures need to be added to the functional layers (bottom layer 904 and top layer 907) apart from conventional test structures, such as the first test scan chains 926 and the second test scan chains 939.

In some cases, a partial-assembly test of a single functional layer, such as the bottom layer 904, by placing probe pads 1036, 1037 on the dedicated test layer 910. Test access via the probe pads 1036, 1037 allows testing prior to completion of the stack of all functional layers. The probe pads 1036, 1037 can be removed prior to forming the next functional layer.

Referring still to FIG. 10, a primary test is used test the functional layer for which the dedicated test layer 910 is the primary interface. In the illustrated example, the function layer for the primary test is the bottom layer 904. The test signal comes into the interface register 950 of the dedicated test layer 910 through a data input port, such as test data in (TDI) 945. The instruction register 1010 controls the first multiplexer 1027 to pass the test signal through. The TAP controller 1013 controls the second multiplexer 1028 to pass the test signal to the first test scan chains 926 of the bottom layer 904. The output of the first test scan chains 926 passes through the third multiplexer 1029 to a data output port, such as test data out (TDO) 946.

Figure 11:
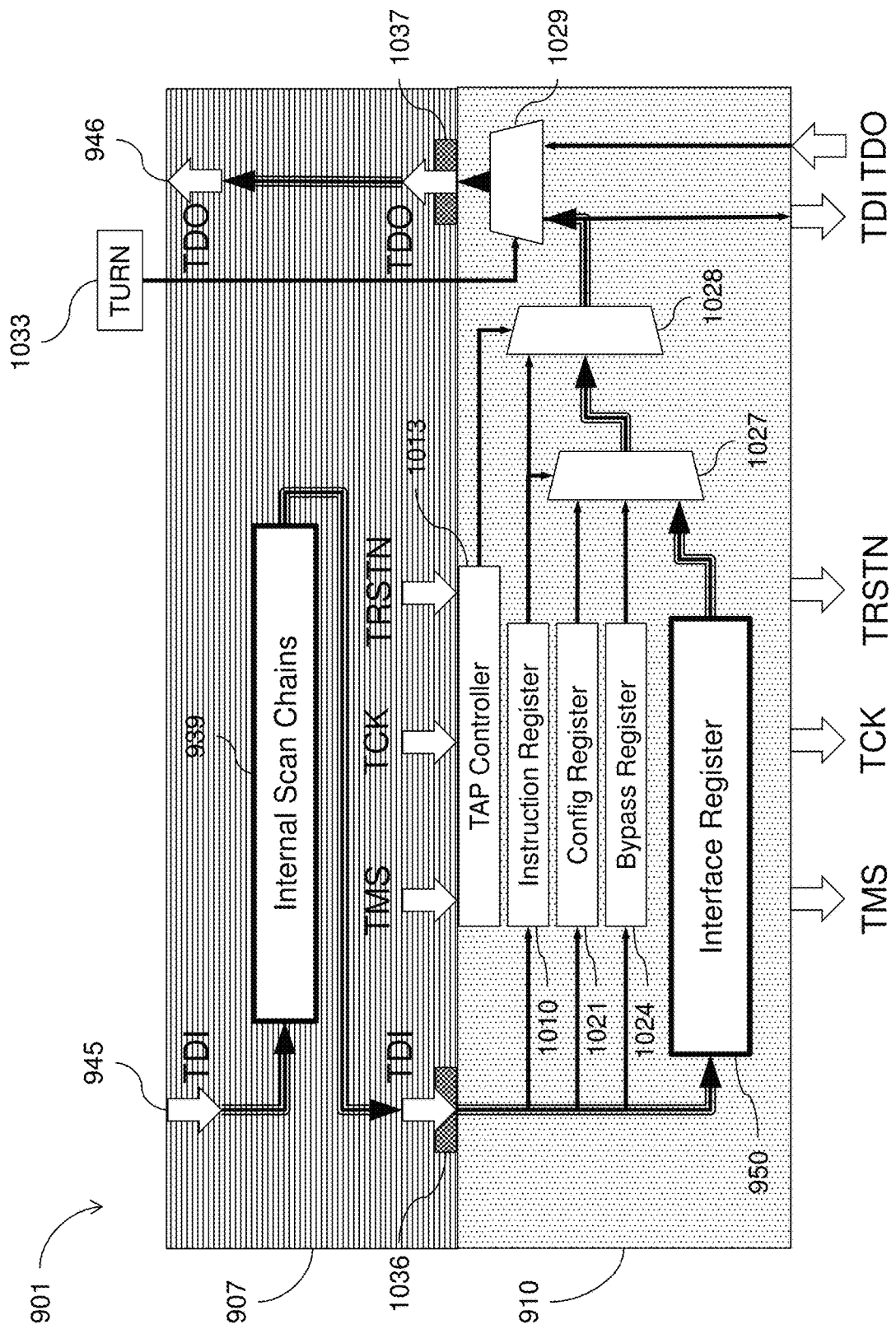
FIG. 11 is a schematic diagram of an exemplary test structure for which the test layer is the secondary interface with the functional layer according to devices and methods herein.

Referring to FIG. 11, a secondary test is used test the functional layer for which the dedicated test layer 910 is the secondary interface. In the illustrated example, the function layer for the secondary test is the top layer 907. The test signal comes into the top layer 907 through the data input port, test data in (TDI) 945 to the second test scan chains 939 of the top layer 907. The output of the second test scan chains 939 passes into the interface register 950 of the dedicated test layer 910. The instruction register 1010 controls the first multiplexer 1027 to pass through the test signal. The TAP controller 1013 controls the second multiplexer 1028 to pass the test signal. The output of the second test scan chains 939 then passes through the third multiplexer 1029 to the data output port, test data out (TDO) 946.

Figure 12:
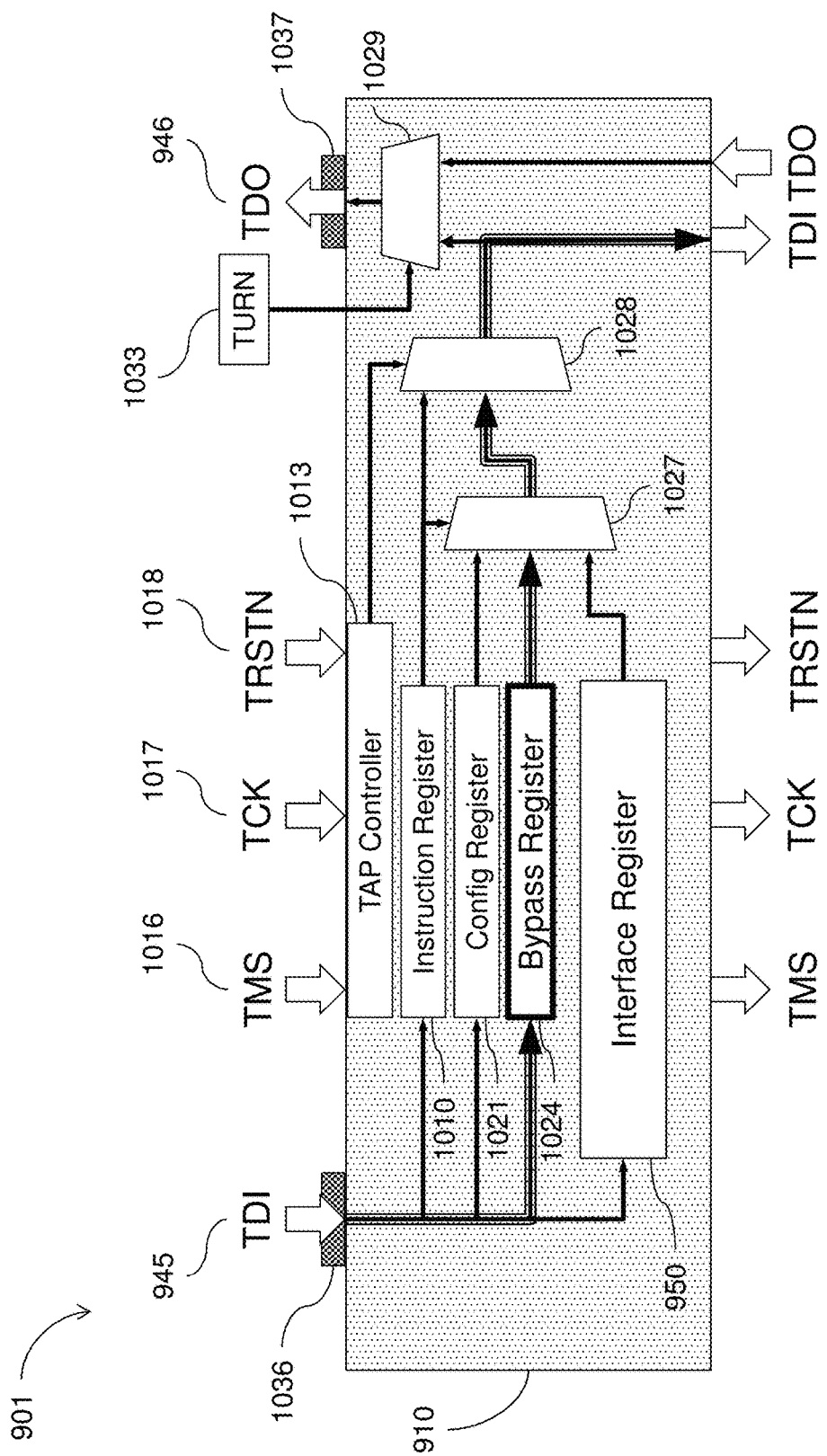
FIG. 12 is a schematic diagram of an exemplary test layer in which only the bypass register is included in the test access chain according to devices and methods herein.

In FIG. 12, only the bypass register 1024 is included in the test access chain. This can be used to test the dedicated test layer 910. The test signal comes into the dedicated test layer 910 through the data input port, test data in (TDI) 945 or probe pad 1036. The instruction register 1010 controls the first multiplexer 1027 to pass through the test signal. The TAP controller 1013 controls the second multiplexer 1028 to pass the test signal. The output then passes through the third multiplexer 1029 to the data output port, test data out (TDO) 946 or probe pad 1037.

Figure 13:
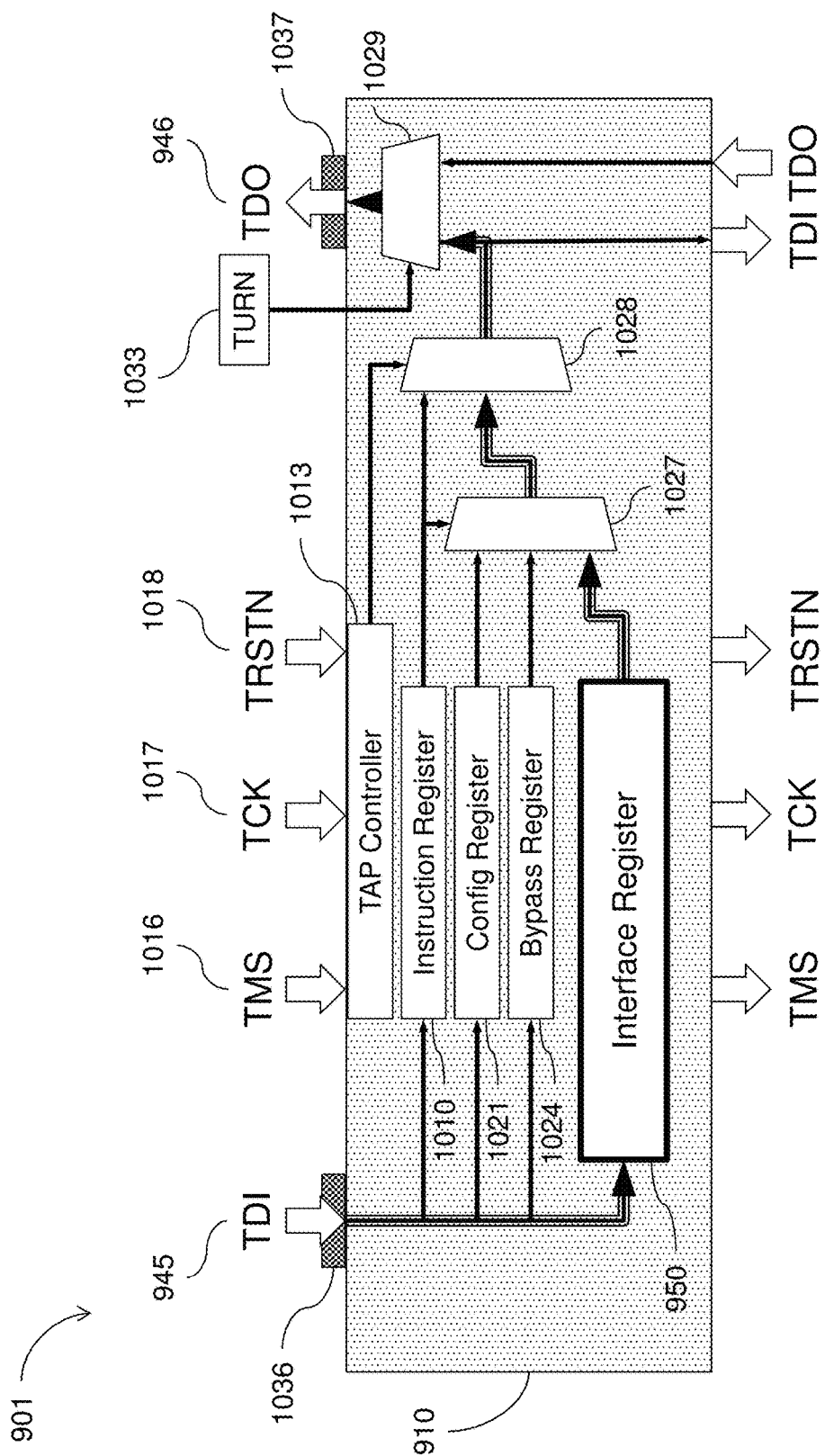
FIG. 13 is a schematic diagram of an exemplary test layer for testing the interface layer according to devices and methods herein.

In FIG. 13, the interface register 950 is included in the test access chain. The test signal comes into the dedicated test layer 910 through the data input port, test data in (TDI) 945 or probe pad 1036. The instruction register 1010 controls the first multiplexer 1027 to pass through the test signal. The TAP controller 1013 controls the second multiplexer 1028 to pass the test signal. The output then passes through the third multiplexer 1029 to the data output port, test data out (TDO) 946 or probe pad 1037.

A test of a full assembly can be performed using the I/O pins 913.

A. Serial Test Mode

A serial test mode can be utilized based on IEEE Std. 1149.1. In order to enable the serial test mode, the dedicated test layer 910 is equipped with an IEEE 1149.1-compliant test access port (TAP), consisting of four input terminals TDI, TCK, TMS, and TRSTN, and an output terminal TDO. The dedicated test layer 910 also contains an IEEE 1149.1 TAP controller. The registers in the dedicated test layer 910 are:

(i) instruction register to program the test mode, e.g., Intest, Extest, Bypass, etc., and to select a test data register to be active between TDI and TDO, (ii) configuration registers to determine the TAP configuration, (iii) bypass register to bypass a test layer.

The instruction register 1010 may include the following instructions for:

(i) INTERFACE: select the interface register between TDI and TDO, (ii) CONFIG: configure the TAP, (iii) PRIMARY: transport test data to the functional layer for which the test layer is the primary interface, (iv) BYPASS: bypass the test layer, (v) SECONDARY: transport test data to the functional layer for which the test layer is the secondary interface.

Exemplary configurations supported by the configuration register 1021 may include:

(i) COMPLETE-ASSEMBLY-TURN, (ii) COMPLETE-ASSEMBLY-ELEVATE, (iii) PARTIAL-ASSEMBLY-TURN, and (iv) PARTIAL-ASSEMBLY-ELEVATE.

In the PARTIAL-ASSEMBLY and COMPLETE-ASSEMBLY configurations, the test access may be via probe pads 1036, 1037 and the ILVs 821, respectively. In the TURN configuration, the test-access mechanism turns backwards from this layer, and in the ELEVATE configuration, it goes up to the next layer.

B. Parallel Test Mode

A parallel interface of a test layer can be based on the flexible parallel port (FPP) in P1838. Since interface registers are inserted here at the primary and secondary interface of each functional layer, grouping of scan chains and test control mechanism will be significantly different from P1838. The control signals needed for the parallel interface are held in a configuration register 1021 referred to as the parallel port (PP) configuration register. The serial interface of a test layer is used to program the PP configuration register. The number of bits in it depends on the width of the parallel interface. A configuration hold bit may also be included to block the reset signal from being propagated to the PP configuration register.

Since the I/O ports in an M3D IC are located on the uppermost layer, the downward parallel bus, i.e., the bus from the uppermost layer to the bottom layer, transports the test stimuli to the target layer, and the upward parallel bus, i.e., the bus from the bottom layer to the uppermost layer, transfers the test responses back to the I/O ports. When the scan chains in the functional layer are bypassed, the test patterns go through a pipeline flip-flop for maintaining timing robustness. On the other hand, when the test patterns go through the scan chains in the functional layer, the pipeline flip-flops are bypassed. Lock-up latches are inserted to ensure that the test data leaves a test layer at the negative edge of the clock signal, thereby minimizing the chance for hold-time violations.

For transporting test stimuli to a functional layer, all the test layers, except those at the primary and secondary interface of the target functional layer, are bypassed. Once the test patterns reach the test layer at the primary interface of the functional layer, they are transported from the input port (Parallel Down In) in the primary test layer to the output port (Parallel Up Out) in the secondary test layer through the scan chains in the functional layer. The control signal Turn decides whether the test responses from the input port (Parallel Up In) or from the functional layer reach the output port (Parallel Up Out). Exemplary configurations supported by the configuration register may include:

(i) PRIMARY TEST-SECONDARY TEST-ELEVATE, (ii) PRIMARY TEST-TURN, (iii) PRIMARY TEST-SECONDARY BYPASS-ELEVATE, (iv) PRIMARY BYPASS-SECONDARY TEST-ELEVATE, (v) PRIMARY BYPASS-TURN, (vi) PRIMARY BYPASS-SECONDARY BYPASS-ELEVATE.

Figure 14:
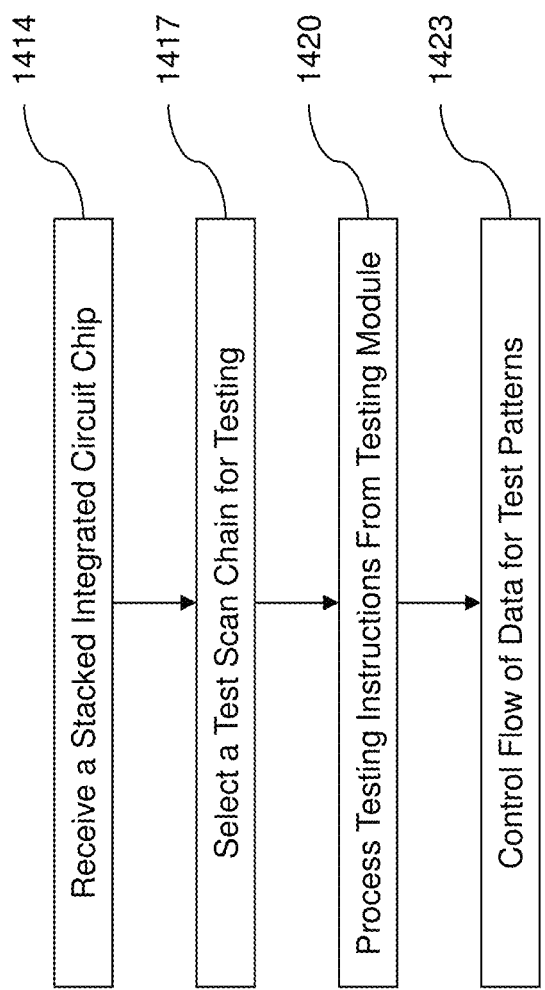
FIG. 14 is a flow diagram illustrating an inspection method that can be used during integrated circuit chip design and fabrication.

FIG. 14 shows a logic flowchart for a method for testing integrated circuit devices, according to devices and methods herein. More specifically, in item 1414, a stacked integrated circuit (IC) chip is received. The stacked IC chip has a first functional layer having first functional components of the integrated circuit and first test scan chains connected to the first functional components. The first scan chains have first input and output connections to a testing module. The stacked IC chip has a second functional layer having second functional components of the integrated circuit and second test scan chains connected to the second functional components. The second scan chains have second input and output connections to the testing module. A test layer is between the first functional layer and the second functional layer, the test layer has an interface register connected to the first test scan chains and the second test scan chains. An instruction register is connected to the interface register. A test access point (TAP) controller is connected to the interface register and the instruction register. Inter-layer vias connect the testing module to the first test scan chains and the second test scan chains through the interface register of test layer. At 1417, one of the first test scan chains and the second test scan chains is selected for testing using the interface register. At 1420, testing instructions are processed from the testing module to the one of the first test scan chains and the second test scan chains using the instruction register. The testing instructions generate test patterns for detecting faults in one of the first functional layer and the second functional layer according to associated test chains. At 1423, the flow of data for the test patterns is controlled using the TAP controller connected to the interface register and the instruction register.

In summary, according to devices herein, an exemplary structure has a first functional layer 904 with a top surface and a bottom surface. The first functional layer includes first functional components of an integrated circuit (IC), and first test scan chains 926 connected to the first functional components. The first scan chains 926 have first input and output connections. A first inter-layer dielectric layer 929 having a top surface and a bottom surface is formed on the first functional layer 904. The bottom surface of the first inter-layer dielectric layer 929 is connected to the top surface of the first functional layer 904. A test layer 910 having a top surface and a bottom surface is formed on the first inter-layer dielectric layer 929. The bottom surface of the test layer 910 is connected to the top surface of the first inter-layer dielectric layer 929. A second inter-layer dielectric layer 932 having a top surface and a bottom surface is formed on the test layer 910. The bottom surface of the second inter-layer dielectric layer 932 is connected to the top surface of the test layer 910. A second functional layer 907 having a top surface and a bottom surface is formed on the second inter-layer dielectric layer 932. The bottom surface of the second functional layer 907 is connected to the top surface of the second inter-layer dielectric layer 932. The second functional layer 907 includes second functional components of the IC, and second test scan chains 939 connected to the second functional components. The second scan chains 939 have second input and output connections. A third inter-layer dielectric layer 942 having a top surface and a bottom surface is formed on the second functional layer 907. The bottom surface of the third inter-layer dielectric layer 942 is connected to the top surface of the second functional layer 907 and has connections to a testing module. The test layer 910 includes an interface register 950 controlling signals from the testing module to one of the first test scan chains 926 and the second test scan chains 939 and an instruction register 1010 connected to the interface register 950. The instruction register 1010 processes testing instructions from the testing module. A test access point (TAP) controller 1013 is connected to the interface register 950 and the instruction register 1010. A first multiplexer 1027 has a data input from the interface register 950 and a control input from the instruction register 1010. A second multiplexer 1028 has a data input from the instruction register 1010 and from the output of the first multiplexer 1027 and a control input from the TAP controller 1013. Inter-layer vias 821 connect the testing module to the first test scan chains 926 and the second test scan chains 939 through the interface register 950 of the test layer 910.

Figure 15:
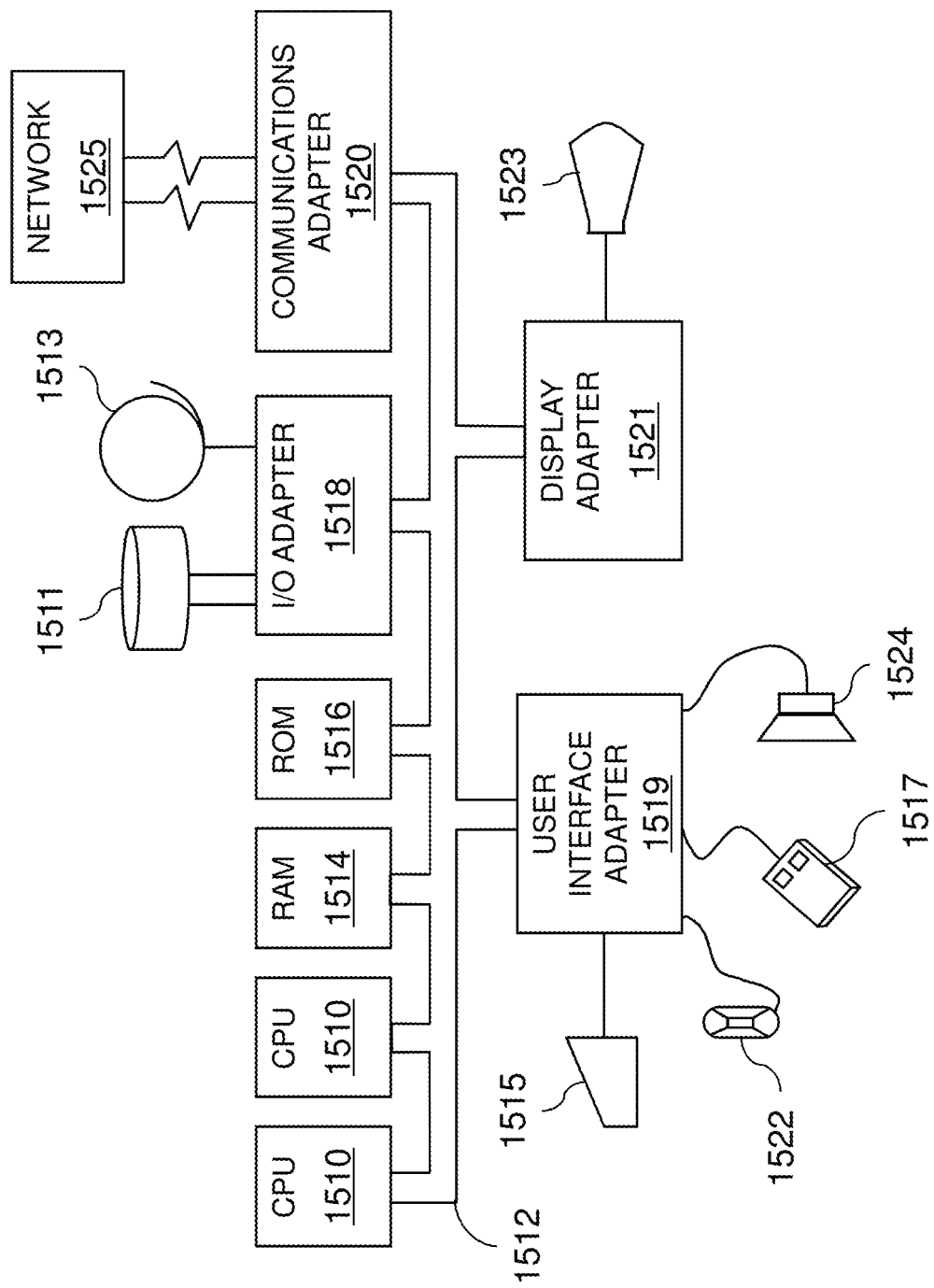
FIG. 15 is a schematic diagram illustrating a representative hardware environment (i.e., a representative computer system) for implementing the disclosed method, system, and computer program product.

A representative hardware environment for practicing the systems and methods herein is depicted in FIG. 15. This schematic drawing illustrates a hardware configuration of an information handling/computer system in accordance with the systems and methods herein. The system includes at least one processor or central processing unit (CPU) 1510. The CPUs 1510 are interconnected via system bus 1512 to various devices such as a Random Access Memory (RAM) 1514, Read Only Memory (ROM) 1516, and an Input/Output (I/O) adapter 1518. The I/O adapter 1518 can connect to peripheral devices, such as disk units 1511 and tape drives 1513, or other program storage devices that are readable by the system. The system can read the inventive instructions on the program storage devices and follow these instructions to execute the methodology of the systems and methods herein.

In FIG. 15, CPUs 1510 perform various processing based on a program stored in a Read Only Memory (ROM) 1516 or a program loaded from a peripheral device, such as disk units 1511 and tape drives 1513 to a Random Access Memory (RAM) 1514. In the RAM 1514, required data when the CPU 1510 performs the various processing or the like is also stored, as necessary. The CPU 1510, the ROM 1516, and the RAM 1514 are connected to one another via a bus 1512. An input/output adapter 1518 is also connected to the bus 1512 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 1514, as necessary.

The system further includes a user interface adapter 1519 that connects a keyboard 1515, mouse 1517, speaker 1524, microphone 1522, and/or other user interface devices such as a touch screen device (not shown) to the bus 1512 to gather user input. Additionally, a communication adapter 1520 including a network interface card such as a LAN card, a modem, or the like connects the bus 1512 to a data processing network 1525. The communication adapter 1520 performs communication processing via a network such as the Internet. A display adapter 1521 connects the bus 1512 to a display device 1523, which may be embodied as an output device such as a monitor (such as a Cathode Ray Tube (CRT), a Liquid Crystal Display (LCD), or the like), printer, or transmitter, for example.

Those skilled in the art would appreciate that the storage medium is not limited to the peripheral device having the program stored therein as illustrated in FIG. 15, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 1516, a hard disk contained in the storage section 1511, or the like, which has the program stored therein and is distributed to the user together with the device that contains them.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

Aspects of the present disclosure are described herein with reference to flowchart illustrations and/or block diagrams of methods, apparatus (systems), and computer program products according to various systems and methods. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The flowchart and block diagrams in the figures illustrate the architecture, functionality, and operation of possible implementations of systems, methods, and computer program products according to various devices and methods herein. In this regard, each block in the flowchart or block diagrams may represent a module, segment, or portion of code, which includes one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

According to a further system and method herein, an article of manufacture is provided that includes a tangible computer readable medium having computer readable instructions embodied therein for performing the steps of the computer implemented methods, including, but not limited to, the method illustrated in FIG. 14. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. Any of these devices may have computer readable instructions for carrying out the steps of the methods described above with reference to FIG. 14.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the systems and methods herein by software and/or firmware, a program constituting the software may be installed into a computer with dedicated hardware, from a storage medium or a network, and the computer is capable of performing various functions if with various programs installed therein.

As will be appreciated by one skilled in the art, aspects of the systems and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read Only Memory (ROM), an Erasable Programmable Read Only Memory (EPROM or Flash memory), an optical fiber, a magnetic storage device, a portable compact disc Read Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terminology used herein is for the purpose of describing particular devices and methods only and is not intended to be limiting of the devices and methods. As used herein, the singular forms "a", "an", and "the" are intended to include the plural forms as well, unless the context clearly indicates otherwise. It will be further understood that the terms "comprises", "comprising", "includes", and "including", when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods of the present invention have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein with various modifications as are suited to the particular use contemplated.

What is claimed is:

1. A structure, comprising:
   a first functional layer comprising first test scan chains;
   a first inter-layer dielectric (ILD) layer on the first functional layer;
   a test layer on the first ILD layer;
   a second ILD layer on the test layer;
   a second functional layer on the second ILD layer, the second functional layer comprising second test scan chains;
   a third ILD layer on the second functional layer and having connections to a testing module, the test layer comprising:
      an interface register controlling signals from the testing module to one of the first test scan chains and the second test scan chains, and
      an instruction register connected to the interface register, the instruction register processing testing instructions from the testing module, wherein the interface register and the instruction register are located in the test layer between the first functional layer and the second functional layer; and
   inter-layer vias connecting the testing module to each of (i) the first test scan chains of the first functional layer; and (ii) the second test scan chains of the second functional layer through the interface register of the test layer and the first, second, and third ILD layers.

2. The structure according to claim 1, the instruction register processing testing instructions from the testing module and selecting a test data register to be active between test data in (TDI) and test data out (TDO).

3. The structure according to claim 1, the test layer further comprising:
   a test access point (TAP) controller connected to the interface register and the instruction register.

4. The structure according to claim 3, the TAP controller being programmable to control the flow of data bits to the instruction register.

5. The structure according to claim 3, the test layer further comprising:
   a first multiplexer having data inputs and control inputs comprising a data input from the interface register and a control input from the instruction register.

6. The structure according to claim 5, the test layer further comprising:
   a second multiplexer having data inputs and control inputs comprising a first data input from the instruction register and a second data input from an output of the first multiplexer and a control input from the TAP controller.

7. The structure according to claim 3, the test layer further comprising:
   a configuration register to determine the configuration for the TAP controller.

8. The structure according to claim 1, the test layer further comprising:
   a bypass register.

9. The structure according to claim 1, each of the first functional layer and the second functional layer further comprising:
   functional components of an integrated circuit, the test scan chains being connected to the functional components;
   test data CoDeCs; and
   test access mechanisms.

10. The structure according to claim 1, each of the first test scan chains and the second test scan chains having input and output connections to the testing module.

11. A structure, comprising:
    a first functional layer having a top surface and a bottom surface, the first functional layer comprising:
       first functional components of an integrated circuit (IC), and
       first test scan chains connected to the first functional components, the first test scan chains having first input and output connections;
    a first inter-layer dielectric (ILD) layer having a top surface and a bottom surface, the bottom surface of the first ILD layer being connected to the top surface of the first functional layer;
    a test layer having a top surface and a bottom surface, the bottom surface of the test layer being connected to the top surface of the first ILD layer;
    a second ILD layer having a top surface and a bottom surface, the bottom surface of the second ILD layer being connected to the top surface of the test layer;
    a second functional layer having a top surface and a bottom surface, the bottom surface of the second functional layer being connected to the top surface of the second ILD layer, the second functional layer comprising:
       second functional components of the IC, and
       second test scan chains connected to the second functional components, the second test scan chains having second input and output connections;
    a third ILD layer having a top surface and a bottom surface, the bottom surface of the third ILD layer being connected to the top surface of the second functional layer and having connections to a testing module,
    the test layer comprising:
       an interface register controlling signals from the testing module to one of the first test scan chains and the second test scan chains, an instruction register connected to the interface register, the instruction register processing testing instructions from the testing module, a test access point (TAP) controller connected to the interface register and the instruction register, a first multiplexer having data inputs and control inputs comprising a data input from the interface register and a control input from the instruction register, and a second multiplexer having data inputs and control inputs comprising a first data input from the instruction register and a second data input from an output of the first multiplexer and a control input from the TAP controller; and inter-layer vias connecting the testing module to the first test scan chains and the second test scan chains through the interface register of the test layer.

12. The structure according to claim 11, the instruction register processing testing instructions from the testing module and selecting a test data register to be active between test data in (TDI) and test data out (TDO).

13. The structure according to claim 11, the TAP controller being programmable to control the flow of data bits to the instruction register.

14. The structure according to claim 11, the test layer further comprising:

a configuration register to determine the configuration for the TAP controller.

15. The structure according to claim 11, the test layer further comprising:

a bypass register.

16. The structure according to claim 11, each of the first functional layer and the second functional layer further comprising:

test data CoDeCs; and test access mechanisms.

17. A method comprising:

receiving a stacked integrated circuit (IC) chip, comprising:

a first functional layer comprising:
first functional components of the IC, and
first test scan chains connected to the first functional components, the first test scan chains having first input and output connections to a testing module;

a second functional layer comprising:
second functional components of the IC, and
second test scan chains connected to the second functional components, the second test scan chains having second input and output connections to the testing module;

a test layer between the first functional layer and the second functional layer, the test layer comprising:
an interface register connected to the first test scan chains and the second test scan chains,
an instruction register connected to the interface register,
a test access point (TAP) controller connected to the interface register and the instruction register, inter-layer vias connecting the testing module to the first test scan chains and the second test scan chains through the interface register of the test layer, selecting one of the first test scan chains and the second test scan chains for testing using the interface register;

processing testing instructions from the testing module to the one of the first test scan chains and the second test scan chains using the instruction register; and controlling the flow of test data using the TAP controller connected to the interface register and the instruction register.

18. The method according to claim 17, wherein the testing instructions generate test patterns for detecting faults in one of the first functional layer and the second functional layer according to associated test chains.

19. The method according to claim 17, wherein the instruction register processes testing instructions from the testing module and selects a test data register to be active between test data in (TDI) and test data out (TDO).

20. The method according to claim 17, further comprising:

bypassing the interface register to apply testing to both the first functional layer and the second functional layer, applying fault testing to each functional layer of the IC.

* * * * *